US010362696B2

(12) United States Patent
Ahn

(10) Patent No.: US 10,362,696 B2
(45) Date of Patent: Jul. 23, 2019

(54) FOLDABLE DISPLAY DEVICE AND METHOD FOR MANUFACTURING THE SAME

(71) Applicant: Samsung Display Co., LTD., Yongin-si, Gyeonggi-Do (KR)

(72) Inventor: Sungsang Ahn, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/875,918

(22) Filed: Jan. 19, 2018

(65) Prior Publication Data

US 2018/0295735 A1    Oct. 11, 2018

(30) Foreign Application Priority Data

Apr. 10, 2017  (KR) .................. 10-2017-0046134

(51) Int. Cl.
| | | |
|---|---|---|
| *G06F 1/16* | (2006.01) | |
| *H05K 5/02* | (2006.01) | |
| *H05K 5/00* | (2006.01) | |
| *E05D 3/02* | (2006.01) | |
| *B32B 37/12* | (2006.01) | |
| *G09F 9/30* | (2006.01) | |

(52) U.S. Cl.
CPC ......... *H05K 5/0226* (2013.01); *G06F 1/1641* (2013.01); *G06F 1/1652* (2013.01); *G06F 1/1681* (2013.01); *H05K 5/0017* (2013.01); *B32B 37/12* (2013.01); *B32B 2457/20* (2013.01); *E05D 3/02* (2013.01); *E05Y 2900/606* (2013.01); *G09F 9/301* (2013.01)

(58) Field of Classification Search
CPC .............................. G06F 1/1652; G09F 9/301
USPC ............ 361/679.27, 679.58, 679.55, 679.56; 349/58; 345/901
See application file for complete search history.

(56) References Cited

U.S. PATENT DOCUMENTS

| 7,355,344 | B2* | 4/2008 | Yang | H01L 51/5237 313/498 |
|---|---|---|---|---|
| 7,714,801 | B2* | 5/2010 | Kimmel | G06F 1/1616 345/1.3 |
| 2013/0037228 | A1* | 2/2013 | Verschoor | G06F 1/1652 160/377 |
| 2014/0355195 | A1* | 12/2014 | Kee | G06F 1/1616 361/679.27 |
| 2016/0007441 | A1* | 1/2016 | Matsueda | G06F 1/1652 361/749 |

(Continued)

FOREIGN PATENT DOCUMENTS

| KR | 10-2015-0104407 A | 9/2015 |
|---|---|---|
| KR | 10-2017-0000309 A | 1/2017 |
| KR | 10-2017-0001819 A | 1/2017 |

*Primary Examiner* — Anthony Q Edwards
(74) *Attorney, Agent, or Firm* — Lewis Roca Rothgerber Christie LLP

(57) ABSTRACT

A foldable display device according to example embodiments includes a support member including a first support portion, a second support portion, and a hinge portion connected between the first support portion and the second support portion, the support member being divided into an adhesive area and a non-adhesive area, a coating layer on the non-adhesive area of the support member, an adhesive member integrally on the adhesive area of the support member and the coating layer, and a foldable display module attached on the adhesive member.

20 Claims, 7 Drawing Sheets

(56) References Cited

U.S. PATENT DOCUMENTS

2016/0209874 A1* 7/2016 Choi ..................... G06F 1/1641
2016/0334836 A1* 11/2016 Hong ..................... G06F 1/1616
2016/0338219 A1* 11/2016 Seo ....................... G06F 1/1652
2018/0335679 A1* 11/2018 Hashimoto ............. G02F 1/167
2018/0370186 A1* 12/2018 Everaerts .................. C09J 7/30

* cited by examiner

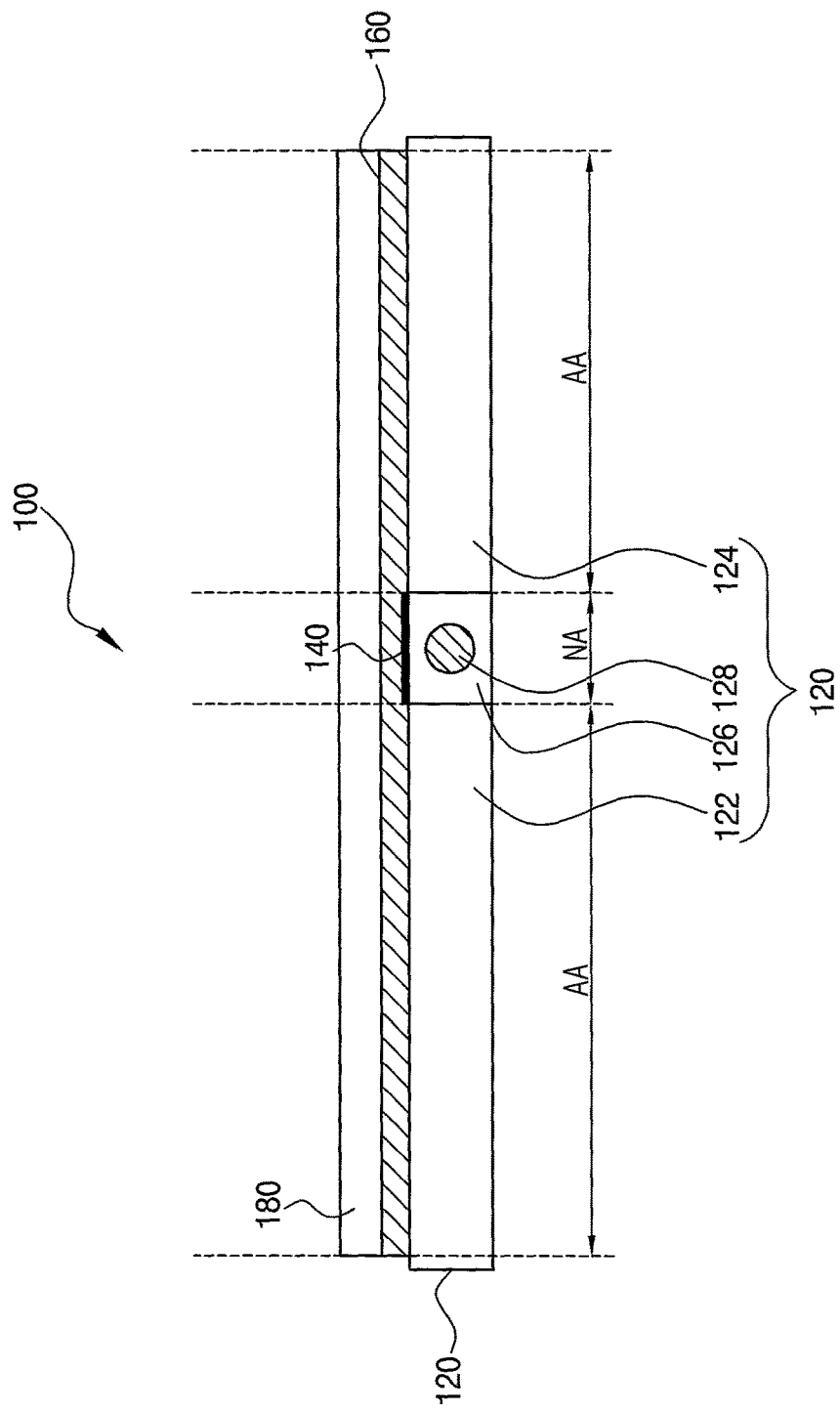

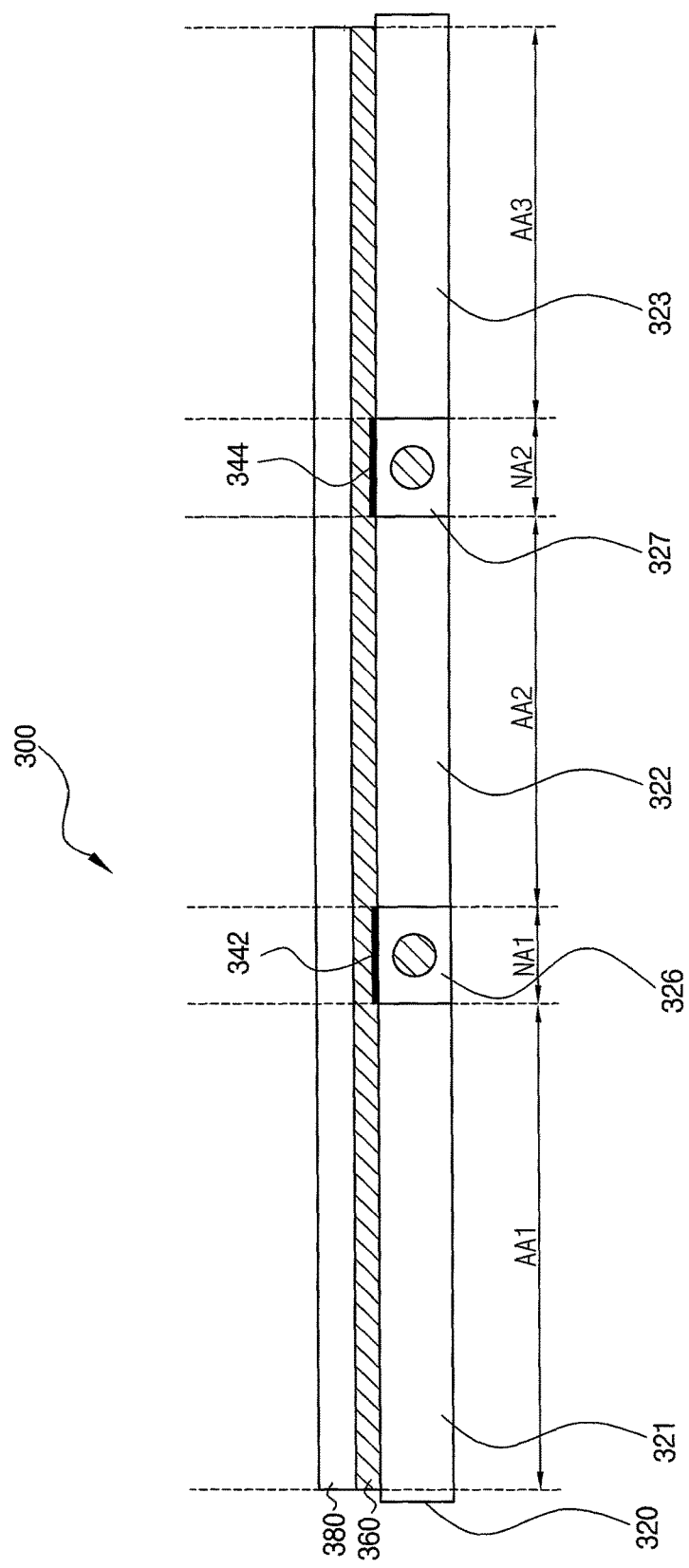

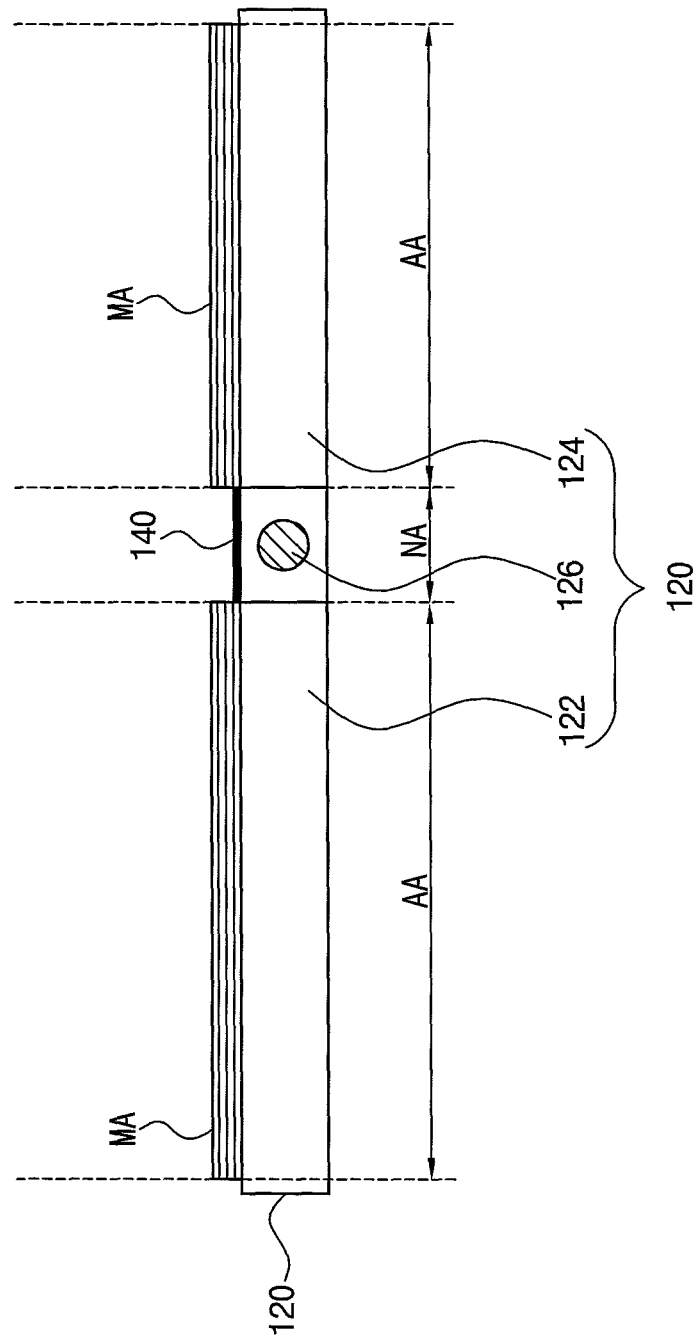

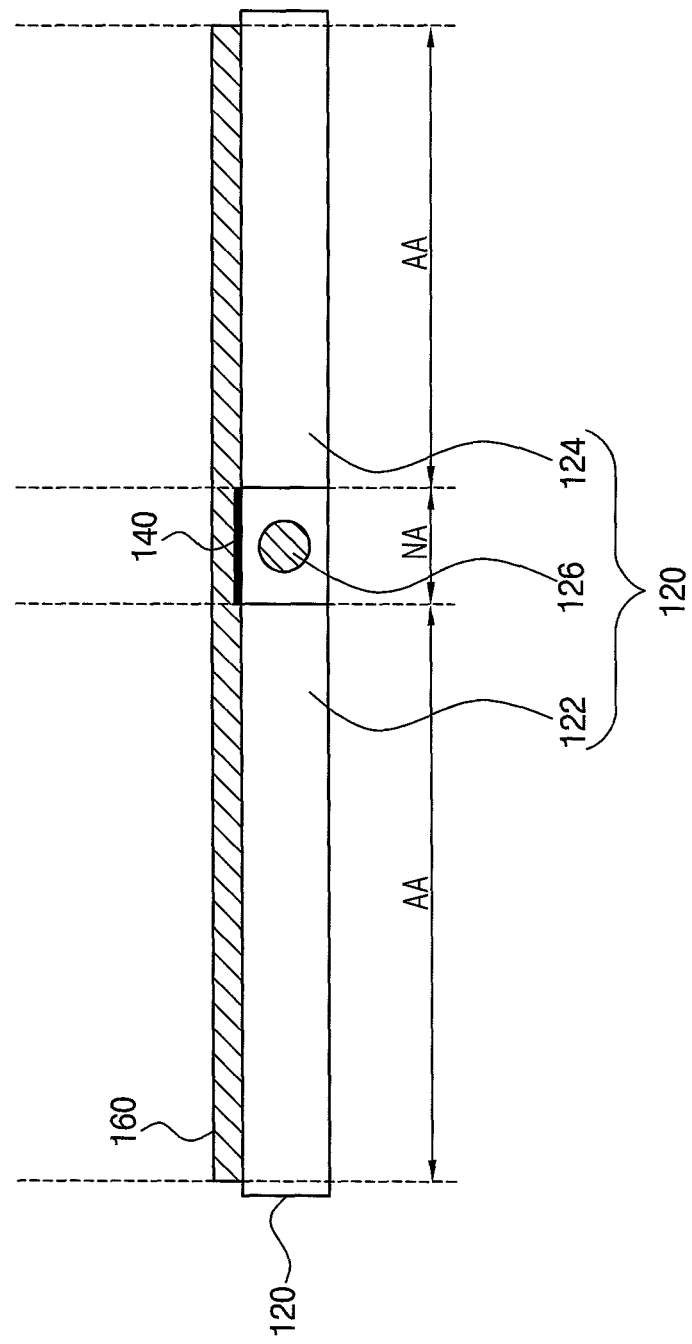

FOLDABLE DISPLAY DEVICE AND METHOD FOR MANUFACTURING THE SAME

CROSS REFERENCE TO RELATED APPLICATION

This application claims priority to and the benefit of Korean Patent Application No. 10-2017-0046134, filed on Apr. 10, 2017, in the Korean Intellectual Property Office (KIPO), the entire content of which is hereby incorporated by reference.

BACKGROUND

1. Field

Example embodiments of the inventive concept relate to display devices. More particularly, example embodiments of the inventive concept relate to foldable display devices including a foldable display module.

2. Discussion of Related Art

A foldable display device, a bendable display device, rollable display, or the like utilizing the advantages of a flexible display panel that can be bent or folded has been recently developed. Such a display device can be applied to various fields such as a television, a monitor, and the like as well as a portable electronic device and a wearable device.

In the case of a foldable display device, a foldable display panel and a support member (a support set) for covering and supporting the foldable display panel are attached with an adhesive or the like. When assembling the foldable display panel with a display device set, a natural folding shape must be forcibly deformed to conform to the shape of the support member.

However, since a curvature of the foldable display panel that naturally bends or folds is different from a curvature of a folded portion (e.g., a hinge portion) of the support member, the foldable display panel and the support member separate (peel off) at this portion. An adhesive member such as an adhesive tape for adhering to the foldable display panel is not formed on the folded portion of the support member, thereby causing a separation of the panel and the support member (i.e., a portion at the folding of the display panel and a corresponding portion at the folding of the support member have different curvatures).

Accordingly, a step is generated between the folding area (folded portion) where the adhesive member is not formed and its adjacent area where the adhesive member is formed, and a difference in surface roughness, unevenness, luminance unevenness, and the like due to the step are visually recognized. In addition, a process and a member for compensating the step are added so that the processing time and cost increase.

SUMMARY

Aspects of example embodiments are directed toward a foldable display device including a coating layer having a non-adhesive area and an adhesive member integrally formed on a support member (e.g., a support).

Aspects of example embodiments provide a method for manufacturing the foldable display device.

According to example embodiments, a display device may comprise a support member (e.g., a support) including a first support portion, a second support portion, and a hinge portion connected between the first support portion and the second support portion, the support member being divided into an adhesive area and a non-adhesive area, a coating layer on the non-adhesive area of the support member, an adhesive member integrally on the adhesive area of the support member and the coating layer, and a foldable display module attached on the adhesive member.

In example embodiments, the coating layer may include a material which is not attached to the adhesive member.

In example embodiments, the coating layer may be a fluorine-based material.

In example embodiments, the coating layer may be a silicon-based material.

In example embodiments, an adhesive strength between the adhesive member and the coating layer may be less than an adhesive strength between the adhesive member and the foldable display module.

In example embodiments, the non-adhesive area corresponding to the coating layer may overlap at least a part of the hinge portion.

In example embodiments, the hinge portion and the non-adhesive area may correspond to a folding axis of the foldable display module.

In example embodiments, at least a part of an upper surface of the coating layer and the adhesive member may be separated from each other by a difference between a curvature of the foldable display module and a curvature of the support member when the foldable display module is folded.

In example embodiments, the entire upper surface of the coating layer and the adhesive member may be in contact with each other when the foldable display module is unfolded.

In example embodiments, the foldable display module and the support member may be in-folded such that light emitting surfaces of the foldable display module oppose each other by a rotational movement of the hinge portion.

In example embodiments, the foldable display module and the support member may be out-folded such that the first support portion of the support member and the second support portion of the support member oppose each other by a rotational movement of the hinge portion.

In example embodiments, a thickness of the coating layer may be 5 um or less.

In example embodiments, a folding angle between the first support portion and the second support portion may be controlled by a rotational movement of the hinge portion.

In example embodiments, an upper surface of the coating layer and the adhesive member may be separated from each other when the folding angle is out of a set or predetermined angle range.

According to example embodiments, a method for manufacturing a foldable display device is provided. The method may comprise coating a coating layer on a non-adhesive area of a support member, the support member being divided into an adhesive area and the non-adhesive area, forming an adhesive member on the support member and the coating layer to integrally cover the adhesive area of the support member and the coating layer, and attaching a foldable display module onto the adhesive member.

In example embodiments, the support member may include a first support portion and second support portion that both correspond to the adhesive area and a hinge portion connected between the first support portion and the second support portion to allow the support member to be folded or unfolded.

In example embodiments, the coating layer may include a fluorine-based material or a silicon-based material.

In example embodiments, the coating layer may be coated on the non-adhesive area of the support member utilizing a mask and/or a jig.

In example embodiments, the coating layer may overlap at least a part of the hinge portion.

In example embodiments, the coating layer and the adhesive member may be separated from each other based on a difference between a curvature of the foldable display module and a curvature of the support member.

Therefore, the foldable display device according to example embodiments may include the coating layer disposed on the non-adhesive area of the support member corresponding to the folding area to weaken an adhesive strength and to remove (or improve) a step difference, and the adhesive member may be integrally formed on the support member. Thus, the step (or the step difference) between the folding area (e.g., the non-adhesive area) and its adjacent area (e.g., the adhesive area) may be eliminated, and the poor visibility in which the step is visible may be reduced.

In addition, the method for manufacturing the foldable display device may simplify the bonding (or attaching) process by forming the thin coating layer that weakens the adhesive strength in the non-bonding area corresponding to the folding area and integrally forming the adhesive member on the support member. Further, the step between the adhesive area and the non-adhesive area can be eliminated by the thin coating layer and the integrally formed adhesive member. Therefore, the manufacturing cost can be reduced and the process time can be shortened. In addition, boundaries (or steps) between the non-adhesive area and the adhesive area may not be visually recognized, thereby improving visibility.

BRIEF DESCRIPTION OF THE DRAWINGS

Example embodiments can be understood in more detail from the following description taken in conjunction with the accompanying drawings, in which:

FIGS. 1A and 1B are cross-sectional views schematically illustrating a foldable display device according to example embodiments.

FIG. 5 is a cross-sectional view schematically illustrating an example of a foldable display device according to example embodiments.

FIGS. 6A to 6C are cross-sectional views of a method for manufacturing a foldable display device according to example embodiments.

DETAILED DESCRIPTION

Exemplary embodiments will be described more fully hereinafter with reference to the accompanying drawings, in which various embodiments are shown.

Figure 1B:
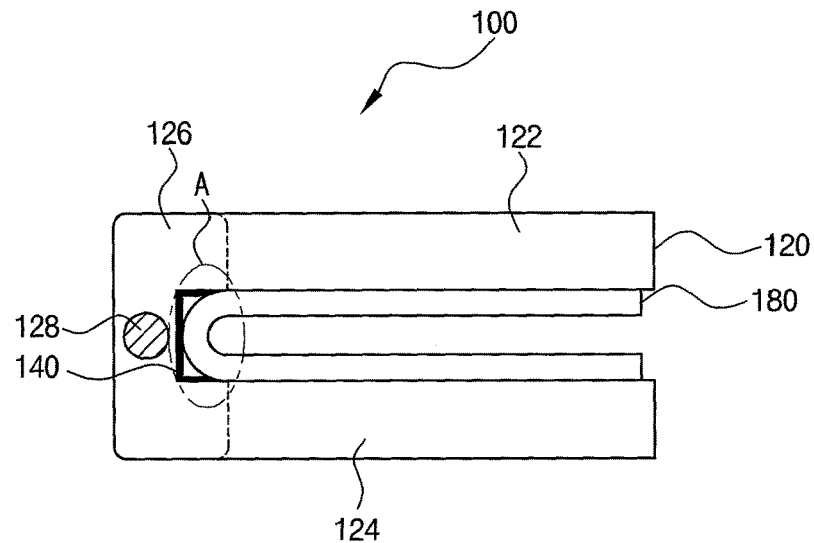

FIGS. 1A and 1B are cross-sectional views schematically illustrating a foldable display device according to example embodiments.

Referring to FIGS. 1A and 1B, the foldable display device 100 may include a support member 120, a coating layer 140, an adhesive member 160, and a foldable display module 180.

FIG. 1A shows a cross-sectional view of the foldable display device 100 in a fully unfolded state, and FIG. 1B shows a cross-sectional view of the foldable display device 100 in a fully folded state.

The support member 120 may include a first support portion 122, a second support portion 124, and a hinge portion 126. In some embodiments, the support member 120 may be formed of a metal and/or a plastic material, and may have a housing structure. However, the material and structure of the support member 120 are not limited thereto.

The first support portion 122 and the second support portion 124 may serve to support the shape of the foldable display module 180. The hinge portion 126 may control the folding angle between the first support portion 122 and the second support portion 124 by rotating. In some embodiments, the hinge portion 126 may include a hinge axis 128 corresponding to a folding axis of the display device 100.

Figure 2:
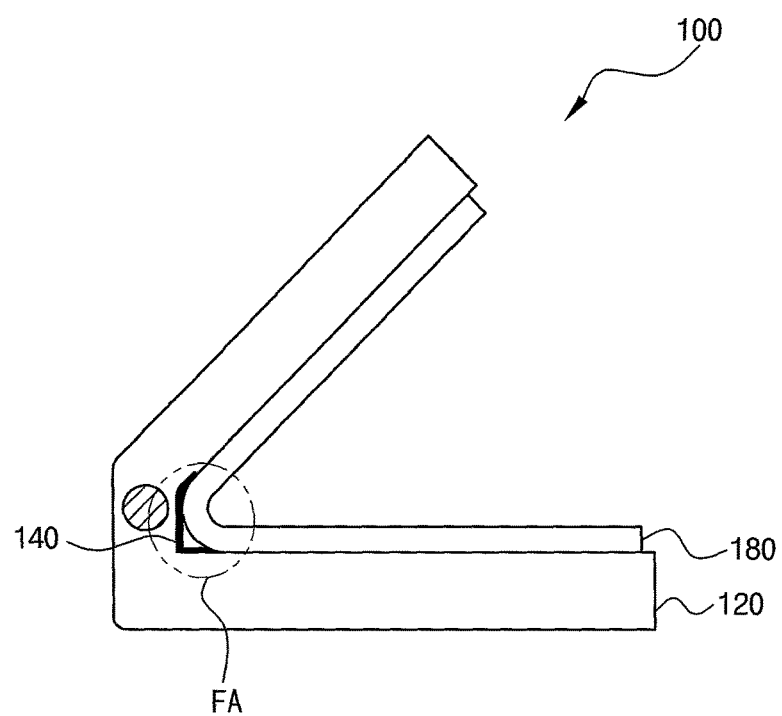
FIG. 2 is a cross-sectional view schematically illustrating an example in which the foldable display device of FIG. 1A is folded.

Further, the support member 120 may be divided into an adhesive area AA and a non-adhesive area NA. The adhesive area AA may correspond to areas where the support member 120 and the foldable display module 180 area are bonded by the adhesive member 160. The non-adhesive area NA may correspond to areas where the support member 120 and the foldable display module 180 contact or separate from each other based on a folding angle. In some embodiments, as illustrated in FIG. 1A, an upper surface of the hinge portion 126, the first support portion 122, and the second support portion 124 of the support member 120 may be substantially flat when the support member 120 is fully unfolded. However, as illustrated in FIGS. 1B and 2, the first and second support portions 122 and 124 may have some folding angles with respect to the hinge portion 126 when the support member 120 is folded.

The coating layer 140 may be disposed on the non-adhesive area NA of the support member 120. The coating layer 140 may include a material having no adhesion to the adhesive member 160 or having a very low adhesion to the adhesive member 160. For example, an adhesive strength between the adhesive member 160 and the coating layer 140 may be significantly lower than an adhesive strength between the adhesive member 160 and the foldable display module 180. The non-adhesive area NA may be portions where the support member 120 and the foldable display module 180 are physically separated according to a structural difference or a curvature difference between the support member 120 and the foldable display module 180 in a folded state of the foldable display device 100 (e.g., represented as 'A' in FIG. 1B). For example, the non-adhesive area NA may correspond to a folding area having the folding axis.

The coating layer 140 may be easily separated from the adhesive member 160 according to the folding angle. In some embodiments, the coating layer 140 may include a fluorine-based material. For example, the coating layer 140 may be formed of a Teflon material. In some embodiments, the coating layer 140 may be formed of a silicon-based material. However, these are examples, and the coating layer 140 may be formed of any suitable material that can be easily separated from the adhesive member 160.

The coating layer 140 may be coated onto the non-adhesive area NA utilizing a mask or a jig. If a thickness of the coating layer 140 is increased, a step may be formed in the adhesive member 160, and the step may be visually recognized. In one embodiment, the thickness of the coating layer 140 may be about 5 um or less. For example, if the thickness of the coating layer 140 is less than about 5 um, the resulting step is not visually recognized.

The adhesive member 160 may be integrally disposed on the adhesive area AA of the support member 120 and the coating layer 140. That is, the adhesive member 160 may cover both the exposed region of the support member 120 corresponding to the foldable display module 180 and the coating layer 140. The adhesive member 160 may include an adhesive tape or a pressure-sensitive adhesive. The thickness of the adhesive member 160 may range from about 20 um to about 100 um. For example, one adhesive tape may be affixed to the support member 120 and the coating layer 140 in a single process to cover the adhesive area AA of the support member 120 and the coating layer 140.

The foldable display module 180 may be attached onto the adhesive member 160. The non-adhesive area NA of the foldable display module 180 or a portion of the foldable display module 180 corresponding to the hinge portion 126 may be bent or folded.

In some embodiments, the foldable display module 180 and the support member 120 may be in-folded by rotating of the hinge portion 126 such that light emitting surfaces of the foldable display module 180 may oppose each other by the rotational movement of the hinge portion 126.

When the foldable display module 180 is folded, the curvature of the folding area of the foldable display module 180 (i.e., the portion corresponding to the non-adhesive area NA) and the curvature of the non-adhering area NA of the support member 120 is bent or folded differently, as illustrated in FIG. 1B. At this time, foldable display module 180 can easily separate from a part of the support member 120 (and the coating layer 140) part in the non-adhesive area NA. When the foldable display module 180 is fully unfolded, the entire upper surface of the coating layer 140 and the adhesive member 160 may be in contact with each other. That is, when an image is output in a state in which the foldable display module 180 is unfolded, defect(s) that a step in the folding area (or the hinge portion 126) and/or a step difference between the hinge portion 126 and the first/second support portions 122 and 124 is visible can be reduced.

In some embodiments, although not shown, the coating layer 140 may be disposed at a lower surface of the display module 180 corresponding to the non-adhesive area NA. In this case, the adhesive member 160 may be disposed on the entire surface of the adhesive area AA and the non-adhesive area NA of the support member 120. That is, the adhesive member may be disposed on the support member 120, the coating layer may be disposed on the adhesive member corresponding to the non-adhesive region NA, and the foldable display module 180 may be disposed on the coating layer and the adhesive member.

As described above, the coating layer 140 for weakening the adhesive strength and eliminating (or improving) the step difference between the hinge portion 126 and the first/second support portions 122 and 124 may be disposed on the non-adhesive area NA of the support member 120 corresponding to the folding area, so that the adhesive member 160 may be integrally formed on the support member 120. Thus, the step (or the step difference) between the folding area (e.g., the non-adhesive area NA) and its adjacent area (e.g., the adhesive area AA) may be eliminated, and the poor visibility in which the step (or the step difference) is visible may be reduced.

FIG. 2 is a cross-sectional view schematically illustrating an example in which the foldable display device of FIG. 1A is folded.

Referring to FIG. 2, the foldable display device 100 may be folded or unfolded at various folding angles.

The adhesive member is interposed between the foldable display module 180 and the support member 120.

A profile (or curvature) of the foldable display module 180 corresponding to a folding area FA and a profile (or curvature) of the support member 120 (i.e., the non-adhesive area) corresponding to the folding area FA may be different from each other. Therefore, in the foldable area FA, a contact portion where the support member 120 (i.e., the coating layer 140) contacts a surface of the display module 180 changes depending on the folding angle. The coating layer 140 having a substantially reduced adhesion with the adhesive member may be coated on the portion of support member 120 corresponding to the folding area FA, i.e., the non-adhesive area.

Accordingly, the portion of the support member 120 corresponding to the coating layer 140 may be easily contacted with or separated from the foldable display module 180 according to a degree of folding of the foldable display module 180 and the support member 120.

Figure 3:
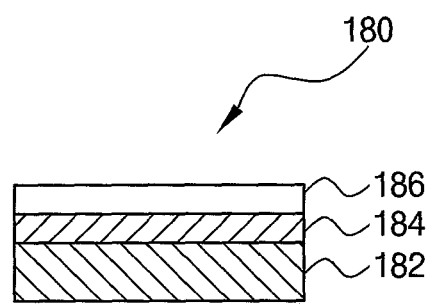
FIG. 3 is a cross-sectional view illustrating an example of a foldable display module included in the foldable display device of FIG. 1A.

FIG. 3 is a cross-sectional view illustrating an example of a foldable display module included in the foldable display device of FIG. 1A.

Referring to FIG. 3, the foldable display module 180 may include a foldable display panel 182, a touch screen 184, and a window member 186.

In some embodiments, the foldable display panel 182 may be a flexible organic light emitting display panel. However, the foldable display panel 182 is not limited thereto. For example, the foldable display panel 182 may be a flexible electrophoretic display panel, a flexible liquid crystal display panel, a flexible electro-wetting display panel, or the like.

In some embodiments, the foldable display panel 182 may include a flexible base substrate, a display element layer, and a thin film encapsulation.

The flexible base substrate may be formed of a flexible plastic material. In some embodiments, a bottom substrate of the flexible base substrate may be directly attached to the adhesive member. Thus, the flexible base substrate and the support member may be attached to each other.

The display element layer may be disposed on the flexible base substrate (e.g., a top surface of the flexible base substrate). The display element layer may include a plurality of pixels. The display element layer may include an element area in which an active element such as a thin film transistor (TFT) is formed and a light emitting area in which a light emitting layer is formed. The element area and the light emitting area may be separately located, or may be overlapped. The light emitting area of the display element layer may include an organic light emitting diode.

The thin film encapsulation may cover the flexible base substrate and the display element layer to prevent oxygen, moisture, and the like from penetrating the display element layer from the outside. In one embodiment, the thin film encapsulation may be formed by alternately stacking one or more organic layers and one or more inorganic layers. The uppermost layer exposed to the outside of the thin film encapsulation may be formed of the inorganic layer to prevent penetration of moisture or the like.

The touch screen 184 may be attached on the foldable display panel 182 or may be embedded in the foldable display panel 182 together with the pixel forming process.

The window member 186 may include a transparent polymer resin, plastic, or the like. The window member 186 may protect the foldable display module 180 from external shocks, scratches, and the like, and may prevent penetration of moisture, oxygen, and/or the like.

In some embodiments, a polarizing member, a phase retardation member, and the like may be further disposed between the foldable display panel 182 and the window member 186. Further, the window member 186 may further include functional layers such as an anti-fingerprint layer, an anti-reflection layer, a hard coating layer, and/or the like.

Figure 4:
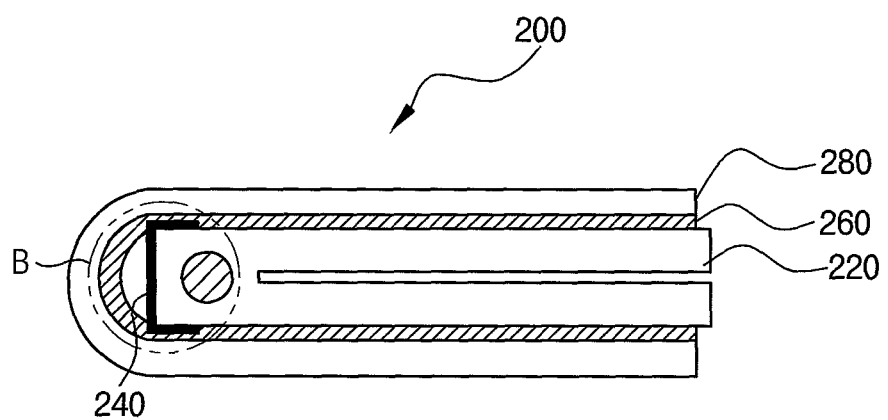
FIG. 4 is a cross-sectional view schematically illustrating an example of a foldable display device according to example embodiments.

FIG. 4 is a cross-sectional view schematically illustrating an example of a foldable display device according to example embodiments.

The foldable display device of the present example embodiments are substantially the same as the foldable display device explained with reference to FIGS. 1A and 1B except for a folding. Thus, the same reference numerals will be used to refer to the same or like parts as those described in the example embodiments of FIGS. 1A and 1B, and any repetitive explanation concerning the above elements will be omitted.

Referring to FIG. 4, the foldable display device 200 may include a support member 220, a coating layer 240, an adhesive member 260, and a foldable display module 280.

The support member 220 may include a support portion for supporting and covering the foldable display module 280, and a hinge portion for controlling a rotation of the support portion. The hinge portion may include a hinge axis corresponding to a folding axis of the foldable display device 200. The support member 220 may be divided into an adhesive area and a non-adhesive area.

The coating layer 240 may be disposed on the non-adhesive area of the support member 220. The coating layer 240 may include a material having no adhesion to the adhesive member 260 or having a very low adhesion to the adhesive member 260. For example, an adhesive strength between the adhesive member 260 and the coating layer 240 may be significantly lower than an adhesive strength between the adhesive member 260 and the foldable display module 280. The non-adhesive area may be portions of the support member 220 and the foldable display module 280 that are physically separated according to a structural difference or a curvature difference between the support member 220 and the foldable display module 280 in a folded state of the foldable display device 200 (e.g., represented as 'B' in FIG. 4).

The adhesive member 260 may be integrally disposed on the adhesive area of the support member 220 and the coating layer 240. That is, the adhesive member 260 may cover both the exposed region of the support member 220 corresponding to the foldable display module 280 and the coating layer 240, since a thickness of the coating layer 240 may be less than or equal to 20 um. Therefore, it can be seen that there is almost no step between the coating layer 240 and the adjacent region, and the step is not visually recognized.

The foldable display module 280 may be attached onto the adhesive member 260. The non-adhesive area of the foldable display module 280 or a portion of the foldable display module 280 overlapping the non-adhesive area B may be bent or folded.

In some embodiments, as illustrated in FIG. 4, the foldable display module 280 and the support member 220 may be out-folded such that the support portions of the support member are opposed to each other by a rotational movement of the hinge portion.

When the foldable display module 180 is out-folded, as illustrated in FIG. 4, the curvature of the folding area of the foldable display module 280 (i.e., the portion corresponding to 'B' in FIG. 4) and the curvature of a portion of support member 220 corresponding to the coating layer 240 is bent or folded differently. At this time, the foldable display module 280 can easily separate from a part of the support member 220 (and the coating layer 240). When the foldable display module 280 is fully unfolded, the entire upper surface of the coating layer 240 and the adhesive member 260 may be in contact with each other. That is, a step between the non-adhesive area B and its adjacent portions may be eliminated in a state in which the foldable display module 280 is unfolded.

In some embodiments, the arrangement position of the coating layer 240 and the adhesive member 260 may be changed. For example, the coating layer 240 may directly contact a portion of the foldable display module 280, and the adhesive member 260 may be formed entirely on one side of the support member 220.

FIG. 5 is a cross-sectional view schematically illustrating an example of a foldable display device according to example embodiments.

The foldable display device of the present example embodiments are substantially the same as the foldable display device explained with reference to FIGS. 1A and 1B except for a folding. Thus, the same reference numerals will be used to refer to the same or like parts as those described in the example embodiments of FIGS. 1A and 1B, and any repetitive explanation concerning the above elements will be omitted.

Referring to FIG. 5, the foldable display device 300 may include a support member 320, a plurality of coating layers 342 and 344, an adhesive member 360, and a foldable display module 380.

The foldable display device 300 may include a plurality of folding areas. The folding areas may correspond to hinge portions 326 and 327 and non-adhesive areas NA1 and NA2, respectively. The folding areas may be in-folded or out-folded. Accordingly, the foldable display device 300 may be in various suitable forms. However, this is an example, and the form of the foldable display device is not limited thereto.

In some embodiments, the support member 320 may include first to third support portions 321, 322, and 323 and first and second hinge portions 326 and 327. In some embodiments, the first to third support portions 321, 322, and 323 may correspond to adhesive areas AA1, AA2, and AA3, respectively. The first and second hinge portions 326 and 327 may correspond to non-adhesive areas NA1 and NA2, respectively.

The coating layer 342 and 344 may be disposed on the non-adhesive areas NA1 and NA2 of the support member 320, respectively. The coating layer 342 and 344 may include a material having no adhesion to the adhesive member 360 or having a very low adhesion to the adhesive member 360.

The adhesive member 360 may be integrally disposed on the adhesive areas AA1, AA2, and AA3 of the support member 320 and the coating layer 342 and 344 to cover the support member 320 and the coating layer 342 and 344.

The foldable display module 380 may be attached onto the adhesive member 360. Portions of the foldable display module 280 overlapping the non-adhesive area NA1 and NA2 may be bent or folded. When the foldable display device 300 is folded, the foldable display module 380 can easily separate from a part of the support member 320 by the coating layers 342 and 344. When the foldable display module 280 is unfolded as illustrated in FIG. 5, the entire upper surface of the coating layer 342 and 344 and the adhesive member 360 may be in contact with each other. That is, step differences between the non-adhesive areas NA1 and NA2 and the adhesive areas AA1, AA2, and AA3 may not be visually recognized.

In some embodiments, the arrangement position of the coating layer 342 and 344 and the adhesive member 360 may be changed. For example, the coating layer 342 and 344 may directly contact a portion of the foldable display module 380, and the adhesive member 360 may be formed entirely on one side of the support member 320.

Figure 6C:
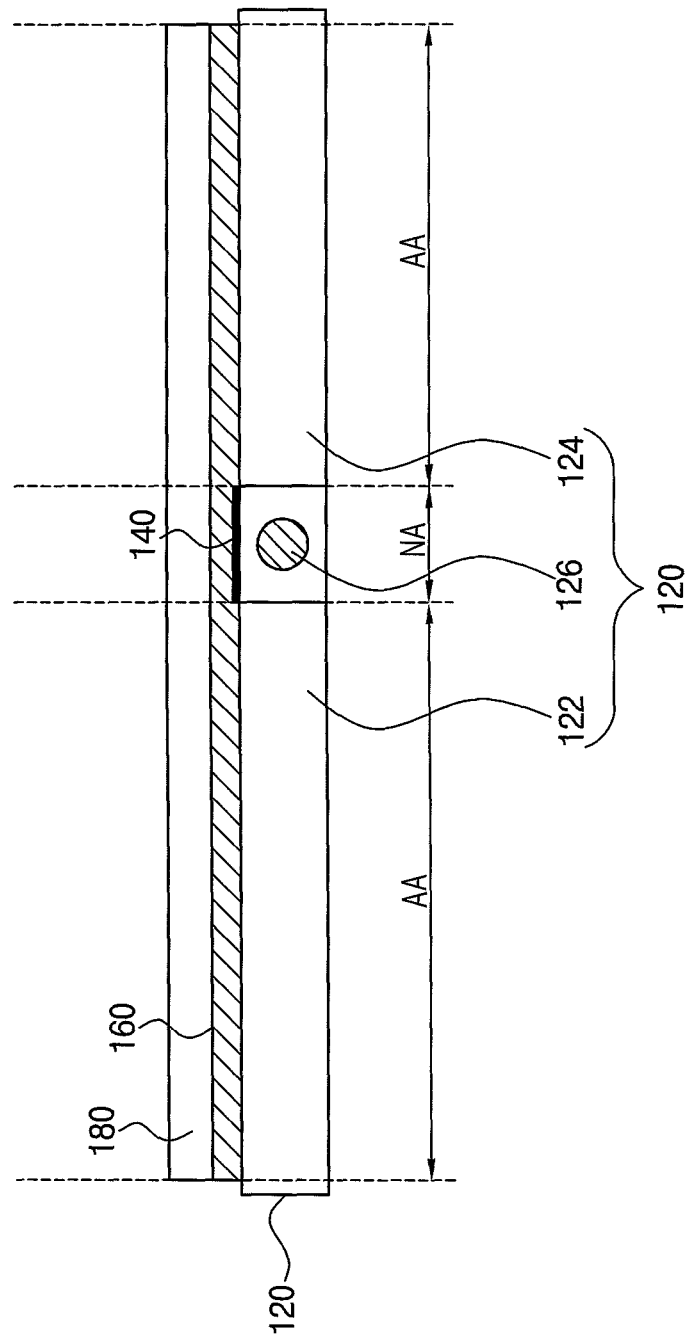

FIGS. 6A to 6C are cross-sectional views of a method for manufacturing a foldable display device according to example embodiments.

Referring to FIGS. 6A to 6C, the method for manufacturing the foldable display device may include coating a coating layer 140 on a non-adhesive area NA of a support member 120 divided into an adhesive area AA and the non-adhesive area NA, forming an adhesive member 160 on the support member 120 and the coating layer 140 to integrally cover the adhesive area AA of the support member 120 and the coating layer 140, and attaching a foldable display module 180 onto the adhesive member 160.

As illustrated in FIG. 6A, the coating layer 140 may be coated on the non-adhesive area NA of the support member 120. In some embodiments, the support member 120 may include first and second support portions 122 and 124 each corresponding to the adhesive area AA and a hinge portion 126 connected between the first support portion 122 and the second support portion 124 to allow the support member 120 to be folded or unfolded. In some embodiments, the coating layer 140 may be coated on the non-adhering area NA by a mask MA deposition process. The coating layer 140 may have a thickness of about 5 um or less. In some embodiments, the coating layer 140 may include a fluorine-based material and/or a silicon-based material. The coating layer 140 may be formed over at least a portion of the hinge portion 126. In addition, the coating layer 140 may be formed over the entire hinge portion 126 and a part of the first and second supporting portions 122 and 124.

As illustrated in FIG. 6B, the adhesive member 160 may be integrally formed on the adhesive area AA and the support member 120 and the coating layer 140. The adhesive member 160 may cover both the exposed region of the support member 120 corresponding to the foldable display module 180 and the coating layer 140. The adhesive member 160 may include an adhesive tape or a pressure-sensitive adhesive. A thickness of the adhesive member 160 may range from about 20 um to about 100 um. That is, the process of forming separate adhesive members on the first support portion 122 and the second support portion 124 can be simplified to a single process. In addition, since the adhesive member 160 is formed entirely on the support member 120, a step between the adhesive area AA and the non-adhesive area NA of the foldable display device can be substantially eliminated.

As illustrated in FIG. 6C, the foldable display module 180 may be attached onto the adhesive member 160. Accordingly, the foldable display device in which the foldable display module 180 is covered and supported by the support member 120 may be manufactured.

As described above, the method for manufacturing the foldable display device according to example embodiments may simplify the bonding (or attaching) process by forming the thin coating layer 140 that weakens the adhesive strength in the non-bonding area NA corresponding to the folding area and integrally forming the adhesive member 160 on the support member 120. Further, the step between the adhesive area AA and the non-adhesive area NA can be eliminated by the thin coating layer 140 and the integrally formed adhesive member 160. Therefore, the manufacturing cost can be reduced and the process time can be shortened. In addition, boundaries (or steps) between the hinge portion 126 and the support portions 122, 124 of the display device 100 may not be visually recognized, thereby improving visibility.

The present embodiments may be applied to any display device and any electronic device including the display device. For example, the present embodiments may be applied to a foldable display device, a flexible display device, a bendable display device, and the like. Further, the present embodiments may be applied to a television, a computer monitor, a laptop, a digital camera, a cellular phone, a smart phone, a smart pad, a personal digital assistant (PDA), a portable multimedia player (PMP), a MP3 player, a navigation system, a game console, a video phone, a head up display device, a wearable display device, etc.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. A foldable display device, comprising:
   a support member comprising a first support portion, a second support portion, and a hinge portion connected between the first support portion and the second support portion, the support member being divided into an adhesive area and a non-adhesive area;
   a coating layer on the non-adhesive area of the support member;
   an adhesive member on the adhesive area of the support member and the coating layer; and
   a foldable display module on the adhesive member.

2. The foldable display device of claim 1, wherein the coating layer comprises a material which is not attached to the adhesive member.

3. The foldable display device of claim 2, wherein the coating layer is a fluorine-based material.

4. The foldable display device of claim 2, wherein the coating layer is a silicon-based material.

5. The foldable display device of claim 2, wherein an adhesive strength between the adhesive member and the coating layer is less than an adhesive strength between the adhesive member and the foldable display module.

6. The foldable display device of claim 2, wherein the non-adhesive area corresponding to the coating layer overlaps at least a part of the hinge portion.

7. The foldable display device of claim 6, wherein the hinge portion and the non-adhesive area correspond to a folding axis of the foldable display module.

8. The foldable display device of claim 6, wherein at least a part of an upper surface of the coating layer and the adhesive member are separated from each other by a difference between a curvature of the foldable display module and a curvature of the support member when the foldable display module is folded.

9. The foldable display device of claim 8, wherein the entire upper surface of the coating layer and the adhesive member are in contact with each other when the foldable display module is unfolded.

10. The foldable display device of claim 2, wherein the foldable display module and the support member are in-folded such that light emitting surfaces of the foldable display module oppose each other by a rotational movement of the hinge portion.

11. The foldable display device of claim 2, wherein the foldable display module and the support member are out-folded such that the first support portion of the support member and the second support portion of the support member oppose each other by a rotational movement of the hinge portion.

12. The foldable display device of claim 2, wherein a thickness of the coating layer is 5 um or less.

13. The foldable display device of claim 2, wherein a folding angle between the first support portion and the second support portion are controlled by a rotational movement of the hinge portion.

14. The foldable display device of claim 13, wherein an upper surface of the coating layer and the adhesive member are separated from each other when the folding angle is out of a set angle range.

15. A method for manufacturing a foldable display device, the method comprising:
    coating a coating layer on a non-adhesive area of a support member, the support member being divided into an adhesive area and the non-adhesive area;
    forming an adhesive member on the support member and the coating layer to integrally cover the adhesive area of the support member and the coating layer; and
    attaching a foldable display module onto the adhesive member.

16. The method of claim 15, wherein the support member comprises:
    a first support portion and second support portion that both correspond to the adhesive area; and
    a hinge portion between the first support portion and the second support portion to allow the support member to be folded or unfolded.

17. The method of claim 16, wherein the coating layer comprises a fluorine-based material and/or a silicon-based material.

18. The method of claim 17, wherein the coating layer is coated on the non-adhesive area of the support member utilizing a mask and/or a jig.

19. The method of claim 17, wherein the coating layer overlaps at least a part of the hinge portion.

20. The method of claim 17, wherein the coating layer and the adhesive member are separated from each other based on a difference between a curvature of the foldable display module and a curvature of the support member.

* * * * *